United States Patent [19]
Beker et al.

[11] Patent Number: 4,748,576
[45] Date of Patent: May 31, 1988

[54] PSEUDO-RANDOM BINARY SEQUENCE GENERATORS

[75] Inventors: Henry J. Beker, Reading, England; Luc Emiel L. Boes, Brussels, Belgium; Peter R. Brennand, Mitcham, England; Edmund R. Brown, Ilford, England; Gerald O. Crowther, Mitcham, England; Wilhelmus M. Dorn, Eindhoven, Netherlands; Stanley M. Edwardson; Stephen R. Ely, both of Tadworth, England; Louis C. Guillou, Bougbarre, France; Peter M. Jenner, Portsmouth, England; Sylvia M. Jennings, Reading, England; Michael J. Knee, Tadworth, England; Arthur G. Mason, Winchester, England; Jean-Marie C. Nicolas, Limeil Brevannes, France

[73] Assignee: U.S. Philips Corporation, New York, N.Y.

[21] Appl. No.: 784,880

[22] PCT Filed: Feb. 4, 1985

[86] PCT No.: PCT/GB85/00051
§ 371 Date: Oct. 1, 1985
§ 102(e) Date: Oct. 1, 1985

[87] PCT Pub. No.: WO85/03678
PCT Pub. Date: Aug. 29, 1985

[30] Foreign Application Priority Data

Feb. 6, 1984 [GB] United Kingdom ............... 8403046
May 16, 1984 [GB] United Kingdom ............... 8412431

[51] Int. Cl.$^4$ .......................................... G06F 1/02
[52] U.S. Cl. ................................................ 364/717
[58] Field of Search ................. 364/717; 307/471; 331/78

[56] References Cited

U.S. PATENT DOCUMENTS

3,881,099 4/1975 Ailett et al. .................. 364/717
4,047,008 9/1977 Perkins .............................. 1/1

OTHER PUBLICATIONS

H. Beker et al, "Cipher Systems-The Protection of Communications", Northwood Publications, 1982, pp. 212, 240–246.
S. Jennings, "Multiplexed Sequences: Some Properties of the Minimum Polynomial", in Cryptography Lecture Notes in Computer Science, vol. 149, pp. 189–206, Published in Proceeding Burg Feuerstein 1982 by Springer Verlag 1983.
S. Jennings, "A Special Class of Binary Sequences", Ph. O. Thesis, Univ. of London, 1980, chapter 2, pp. 57–61 & chapter 4, pp. 156–161.

Primary Examiner—Gary V. Harkcom
Assistant Examiner—Tan V. Mai
Attorney, Agent, or Firm—Robert F. O'Connell

[57] ABSTRACT

A pseudo-random binary sequence generator comprises at least one shift register (S, T) arranged in a recirculating loop and having a plurality of logic gates (G) for logically combining the outputs of selected stages of the register to provide a pseudo-random sequence, and a multiplexer (M), having a p data inputs and q address inputs all connected to selected shift register stages, and which selects at any instant one of the p data input bits in accordance with the q-bit address word to provide the generator output. The number s of logic gates is especially high and is related to the total number r of shift register stages (r>p+q) by the expression: $2^s \geq r^2$. Some of the shift register stages of the or each shift register are connected to selected data inputs of the multiplexer and others of the stages of the same shift register are connected to selected address inputs of the multiplexer. Switches (SW1-SW4) are provided for regularly loading a re-initialization word into the shift register(s), and this re-initialization word can be formed by an arrangement (FIG. 4) which combines a control word with the frame count.

13 Claims, 4 Drawing Sheets

PSEUDO-RANDOM BINARY SEQUENCE GENERATORS

This invention relates to pseudo-random binary sequence generators.

BACKGROUND OF THE INVENTION

Pseudo-random binary sequence generators (p.r.b.s. generators) are well known and reference should be made to the book "Cypher Systems" by Beker and Piper, 1982, published by Northwood Books, London for a description of the construction and operation of such generators. In particular, such generators can take the form of linear-feedback shift registers (LFSRs) and particular reference should be made to LFSRs of the "Galois" or "dual" kind.

P.r.b.s. generators comprise essentially an n stage recirculatory shift register and one or more associated logic gates in the loop for combining the output of at least two register stages. By appropriate choice of the logic gates a repeating sequence can be obtained of length $2^n-1$ bits. If n is a suitably large number this sequence is very long indeed, and the bits can be regarded as random; hence the term "pseudo random".

There may be applications where it is desired to reduce the possibilities of mimicking the generator output, and thus to increase the unpredictability of both the output signal and also the contents of the shift register stages, even when the contents of some of the shift register stages may be known.

SUMMARY OF THE INVENTION

A pseudo-random binary sequence generator using a selector having data inputs and address inputs for selecting at any instant one of the data input bits in accordance with the address input word to provide the generator output. The generator includes a recirculatory shift register with at least one recirculatory loop having a plurality of logic gates for logically combining the outputs of selected stages of the loop to provide a pseudo-random sequence. Data inputs of the selector are connected to the outputs of some of the shift register stages of the loop and address inputs of the selector are connected to the outputs of others of the shift register stages of the same loop.

The invention in its various aspects is defined in the appended claims to which reference should now be made.

DESCRIPTION OF THE DRAWING

The invention will be described by way of example with reference to the drawings, in which FIGS. 1, 2 and 3 each show a block circuit diagram of a respective p.r.b.s. generator embodying the invention.

DESCRIPTION OF THE PREFERRED EMBODIMENTS

Figure 1:
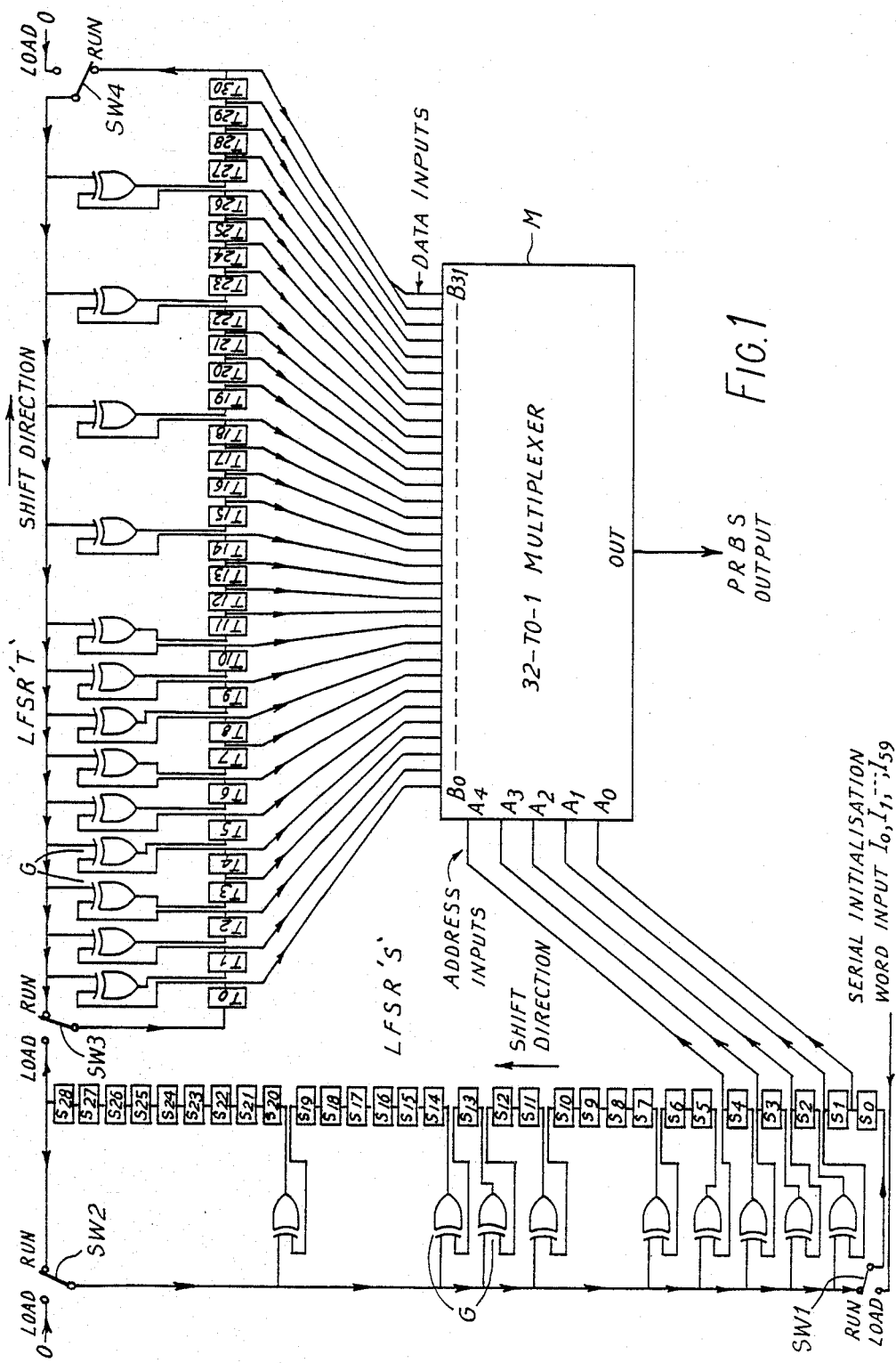

FIG. 1 shows a p.r.b.s. generator which comprises two LFSRs, S and T. The register S has 29 stages $S_0 \ldots S_{28}$ and the register T has 31 stages $T_0 \ldots T_{30}$. In each case the output of the final stage is during normal running applied as the input to the first stage in a recirculating loop. The loop also includes a plurality of logic gates G, in the form of exclusive-OR circuits, which combine the output of the final stage with the output of one shift register stage for application to the next shift register stage.

The positions of the gates G are chosen so that the sequence generated by the register is of maximum possible length. Conventionally, the positions of the gates are described in the form of a polynomial, of the form:

$$f(X) = 1 + C_1 X + C_2 X^2 + \ldots C_i X^i + \ldots + C_{n-1} X^{n-1} + X^n$$

Using this notation, it is seen that p.r.b.s. generator S is of the form $$1 + X^2 + X^3 + X^4 + X^5 + X^7 + X^{11} + X^{13} + X^{14} + X^{20} + X^{29}$$

which means that gates are located at the inputs to stages $S_2, S_3, S_4, S_5, S_7, S_{11}, S_{13}, S_{14}$ and $S_{20}$. Thus, there are nine such gates, and each gate introduces an additional term into the polynomial.

Similarly, p.r.b.s. generator T has gates G at the inputs to stages $T_1, T_2, T_3, T_5, T_6, T_7, T_9, T_{10}, T_{11}, T_{15}, T_{19}, T_{23}$ and $T_{27}$. In this case there are 13 gates.

The circuit of FIG. 1 also includes a multiplexer M, or selector circuit. This has 5 address inputs $A_i$ and 32 data inputs $B_i$ and operates to select one of the data inputs for application to the output in dependence upon the address word applied to the address inputs. More generally, where there are p data inputs there will be q address inputs where q takes the lowest value consistent with $2^q \geq p$.

The data inputs receive the outputs of the stages of the register T such that:

$T_i$ is connected to $B_i$ for $i = 0, 1, \ldots 30$ and $T_{30}$ is also connected to $B_{31}$.

The address inputs receive the outputs of the first five stages of the register S, i.e.:

$S_i$ is connected to $A_i$ for $i = 0, 1, 2, 3, 4$. Thus q outputs are taken from register S.

In use the two registers S and T are clocked simultaneously. The 31-bits of the pseudo-random sequence held in register T are applied to the data inputs of the selector M. One of these bits is selected as the output bit at any instant. The bit selected is determined by the contents of the first five stages of the register S. In this way the output number is difficult to predict even if the contents of register T were to be known.

It should be noted that the total number of shift register stages involved, which is 60, is greater than is required solely to provide the q-bit address and p data bits. If the total number of register stages is r, then:

$$r > p + q.$$

We have appreciated that it is desirable to provide a number of "unused" stages, in the sense that the outputs of these stages are not applied to the selector M, and that this number should be large in relation to the number of address bits. Preferably therefore:

$$r \geq p + q^2.$$

The provision of these unused stages increases the unpredictability of the address word and hence makes it difficult to predict the generator output even if the contents of register T are known.

It will also be seen that the shift registers use a large number of logic gates G, twenty two in fact. As noted above, these gates are chosen in each case to give a maximum length sequence. However, the use of such a large number of gates is not necessary for that purpose alone.

We have appreciated, however, that the more gates there are the more the contents of the shift registers will be difficult to predict, because a given sequence will not simply travel from the beginning of the register to the end but will be liable to change at many points.

Accordingly we propose a minimum of s such logic gates where:

$$2^s \geq r^2,$$

thus providing a high degree of unpredictability in relation to the total number of register stages involved. For a total number of register stages equal to 60, a minimum of 12 logic gates should be provided, preferably with a minimum for each register substantially proportionate to the number of register stages. Normally also s will be less than r/2.

As seen in the figure, switches SW1, SW2, SW3 and SW4 are provided which in normal operation ("RUN") complete the two recirculating loops around registers S and T. However, these four switches can be changed over from the positions shown to the LOAD positions, in which the output of register S is applied as the input of register T, and the gates G all receive a zero at that input which is normally connected to the register output. A 60-bit initialisation word can then be applied to the LOAD input of the switch SW1 which is clocked through all the 60 shift register stages.

This re-initialisation operation takes place regularly during normal operation of the generator on receipt of a defined cue and may take place in a manner such as will be described later with regard to FIG. 4. This again assists in making the output unpredictable even if the contents of the registers become known at any instant.

It may be desirable, after the initialisation word is received, to clock the generator through several cycles before utilizing the generator output.

Figure 2:
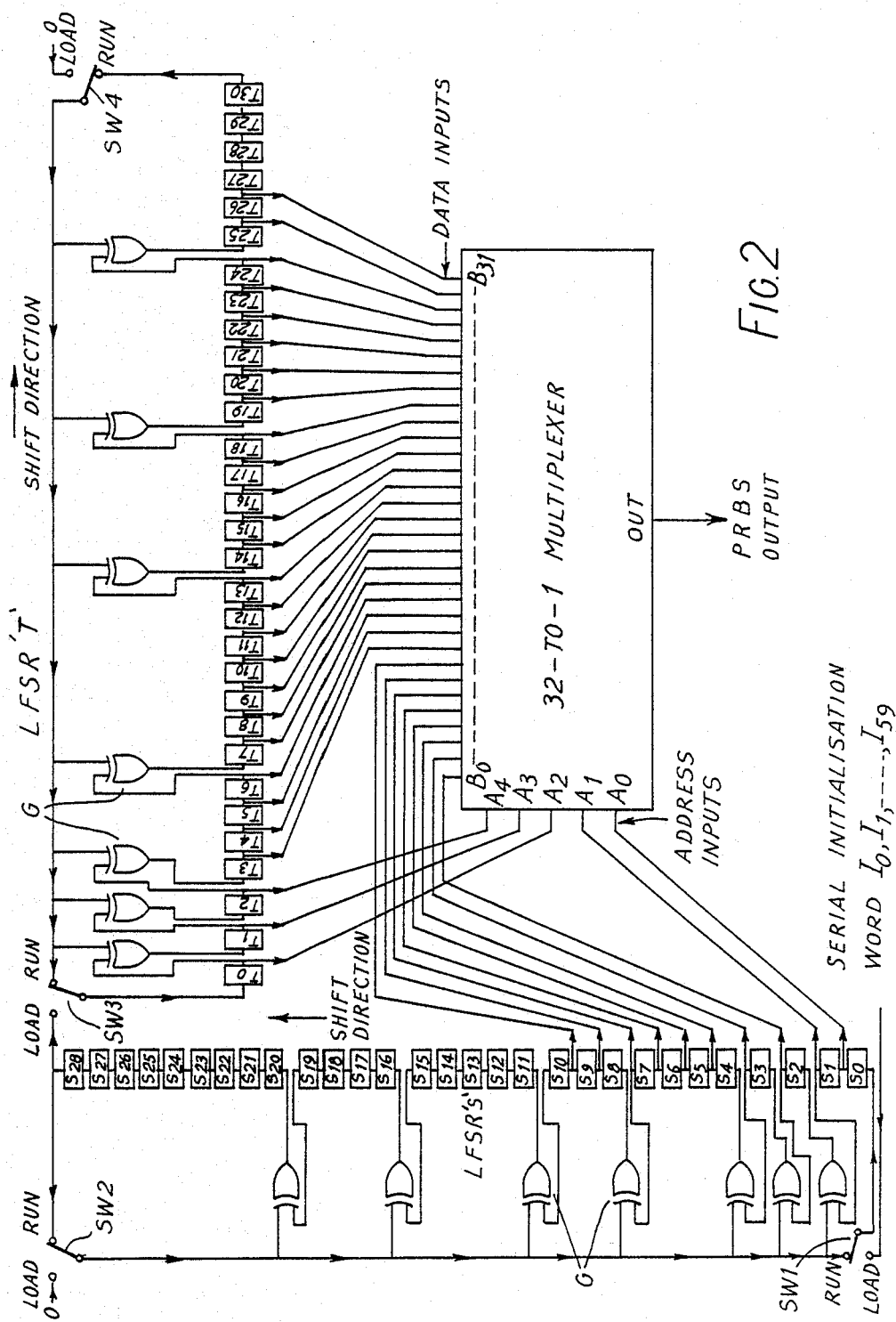

FIG. 2 shows a modification of the generator of FIG. 1. Much of the apparatus is the same as FIG. 1 and only the differences will be described.

Again register S has 29 stages and register T has 31 stages. Gates are now coupled to the inputs of the following stages: in register S—$S_2$, $S_3$, $S_4$, $S_8$, $S_{11}$, $S_{16}$, and $S_{20}$ in register T—$T_1$, $T_2$, $T_3$, $T_7$, $T_{14}$, $T_{19}$ and $T_{25}$. Thus there are 60 register stages altogether, 32 data inputs and 5 address inputs to the selector M, and 14 gates.

In this instance, however, some of the stages of each register are respectively connected to some of each of the data and address inputs. That is to say the connections are as follows:

$A_0$—$S_0$
$A_1$—$S_1$
$A_2$—$T_0$
$A_3$—$T_1$
$A_4$—$T_2$
$B_0$ to $B_7$—$S_2$ to $S_9$ respectively
$B_8$ to $B_{31}$—$T_3$ to $T_{26}$ respectively.

By mixing the outputs of the shift registers and the inputs of the selector M in this way it is again made more difficult to predict the operation of the generator even when a great deal about its state is known.

Figure 3:
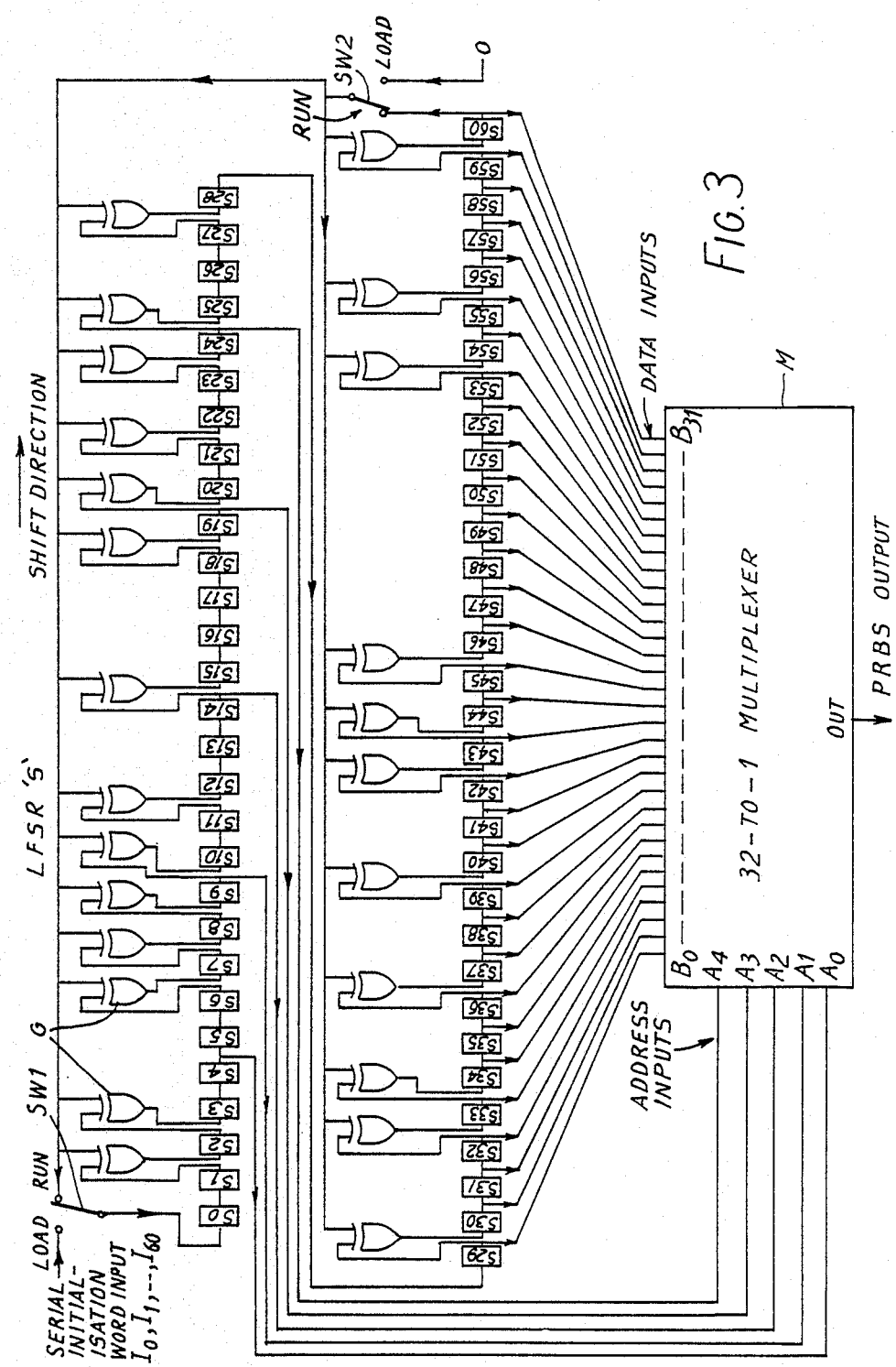

FIG. 3 shows a further variant in which the two shift registers of FIGS. 1 and 2 are replaced by a single shift register S having 61 stages $S_0$ to $S_{60}$. There are 25 logic gates G connected as shown to the inputs of the following stages:

$S_2$, $S_3$, $S_7$, $S_8$, $S_9$, $S_{10}$, $S_{12}$, $S_{15}$,
$S_{19}$, $S_{20}$, $S_{22}$, $S_{24}$, $S_{25}$, $S_{28}$,
$S_{30}$, $S_{33}$, $S_{34}$, $S_{37}$, $S_{40}$, $S_{43}$,
$S_{44}$, $S_{46}$, $S_{54}$, $S_{56}$ and $S_{60}$.

The five address bits $A_0 \ldots A_4$ are taken from the outputs of stages $S_4$, $S_9$, $S_{14}$, $S_{19}$ and $S_{24}$, and the 32 data bits are taken from the outputs of stages $S_{29}$ to $S_{60}$. In this way a single recirculatory loop provides outputs to both the data and the address inputs of the multiplexer M.

In this case only two switches SW1 and SW2 are required for re-initialisation with a 61 bit initialisation word.

The generator of FIG. 3 again uses a single recirculatory loop to provide both address and data input bits to the multiplexer M.

In accordance with conventional practice in this technology the generators have been described and illustrated in terms of discrete circuitry. It will be appreciated however that the description and claims are equally applicable to the implementations of the invention in the form of computer programs, where the generator polynomials may be reproduced mathematically or by logical steps to produce the same resultant sequences as the generators described.

The outputs of the p.r.b.s. generators can be used to scramble the components of a conditional access (or subscription) television signal, such as a DBS signal (direct broadcasting by satellite). Returning to the re-initialisation operation described above, for scrambling a video signal a new code is preferably transmitted say every ten seconds, but the code is repeated many times during that ten second period, as the maximum time for a decoder to lock-in should be much less than one second. However, this means that the picture information is scrambled with repetitions of the same sequence. This is relatively insecure because correlations between different pieces of the scrambled picture can then be made.

An eight-bit frame count word (FCNT) could be transmitted with a television signal, such as a DBS signal, for the purpose of counting television frames. The count is incremented every 40 ms (every frame) and repeats after a predetermined number of frames e.g. every 256 frames (approx. 10 seconds).

Now, this frame count word (FCNT) can then be applied as an input to the p.r.b.s. generator at the transmitter, and to the corresponding generator in the decoder at the receiver. Thus both the frame count signal and a secret control word are fed to the p.r.b.s. generator at the transmitter at the beginning of each television frame. The effect upon the generator of using the frame count signal is to cause it to generate a different output during each loading of the same control word value. This means that the picture signal is always scrambled with a different keystream, which is more secure. Furthermore, since each sequence now begins every television frame (40 ms), fast access may be obtained to the video information at the decoder. The frame count word may be combined with the control word in any suitable manner. Simple modulo-two addition is an obvious example.

Figure 4:
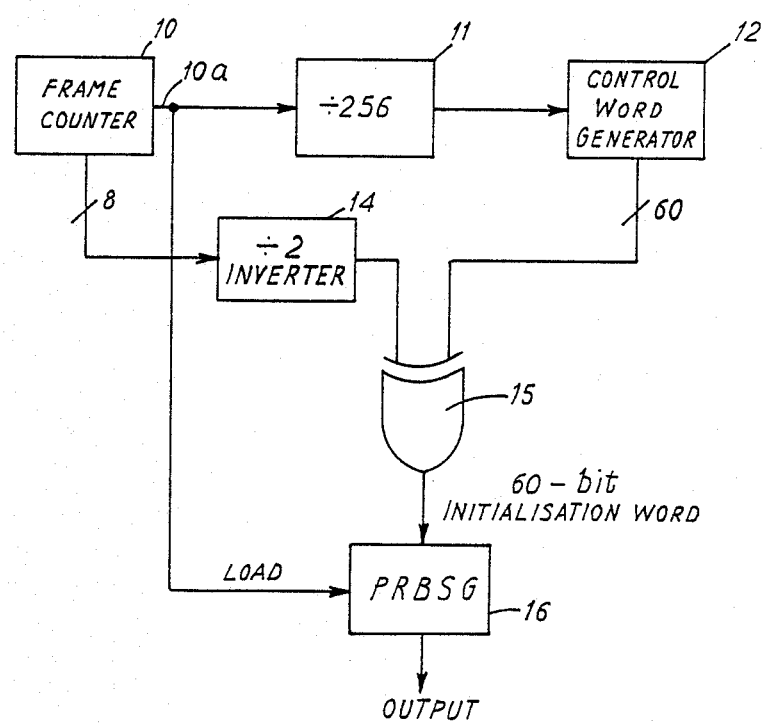
FIG. 4 is a block diagram of a circuit for modifying the input to the p.r.b.s. generator shown in FIGS. 1, 2 or 3.

The above described operation will be more readily understood from the following description with reference to FIG. 4.

A frame counter 10 produces an output in the form of, say, an 8-bit word which increments every frame. Every time the frame counter is incremented, an output 10a is fed to a dividing circuit 11 which divides by a number equivalent to the desired length of the repetition period, in this case by 256 which gives a repetition period of 10 seconds. The dividing circuit provides an output for clocking a control word generator 12 and causing the generator to produce a different long control word e.g. a 60-bit control word.

The 8-bit output of the frame counter is the frame count word (FCNT) and this is fed through a divide-by-2 inverting circuit 14 where every alternate 8-bit FCNT word is complemented. The output of the inverting circuit 14 is then fed to a modulo-2 adder represented by an EX-OR gate 15 where each FCNT word is modulo-2 added to a byte of the 60-bit control word. Thus the first 8-bit byte of the control word is modulo-2 added to the first FCNT word, the second byte added to the complement of the second FCNT word, the third byte added to the third FCNT word and so on until the last byte, which for a 60-bit control word is only 4-bit, the last byte being added to the least significant four bits of the complement of the eighth FCNT word. The output of the gate 15 is fed as the initialisation input to the p.r.b.s. generator 16 and loaded into the generator every frame count i.e. every time the frame counter 10 increments. The generator 16 may be any of the generators illustrated, though is preferably that of FIG. 2.

Thus two signals are applied to the input of the p.r.b.s. generator; one (the frame count) is known but the other (the control word) is not. In these circumstances knowledge of both the known input and the generator output will still not allow the unknown input to be found. Thus the same control word can be repeatedly loaded into the p.r.b.s. generator but its output is prevented from repeating the same sequence, thereby improving the security.

The above processing can be carried out on a word by word basis or on a serial basis.

The frame count is the preferred periodic sequence for these purposes but it may not be the only available sequence. For example, a suitable count may be derived from an associated data signal, such as a date/time signal, or from another count such as the line count, or from a combination of counts.

We claim:

1. A pseudo-random binary sequence generator, comprising:
   selector means having p data inputs and q address inputs ($2^q \geq p$) for selecting at any instant one of the data input bits in accordance with the address input word to provide the generator output;
   recirculatory shift register means having a total of r stages and having s logic gates located between register stages for logically combining the outputs of selected stages to provide a pseudo-random sequence; and
   means connecting the p data input of the selector means to the outputs of selected shift register stages and for connecting the q address inputs of the selector means to the outputs of q selected shift register stages, in which r and s are so chosen that:

$$r > p+q \text{ and } 2^s \geq r^2.$$

2. A generator according to claim 1, in which the number of stages r is so chosen that:

$$r \geq p+q^2.$$

3. A generator according to claim 1, in which the shift register means comprises at least one recirculating loop and the connecting means connects the outputs of some of the shift register stages of the said loop to data inputs of the selector means and the outputs of others of the shift register stages of the same loop to address inputs of the selector means.

4. A generator according to claim 3, including means for regularly loading a re-initialisation word into the shift register means.

5. A pseudo-random binary sequence generator, comprising:
   selector means having p data inputs and q address inputs ($2^q \geq p$) for selecting at any instant one of the data input bits in accordance with the address input word to provide the generator output;
   recirculatory shift register means comprising at least one recirculating loop having a plurality of logic gates for logically combining the outputs of selected stages of the loop to provide a pseudo-random sequence; and
   means connecting the outputs of some of the shift register stages of the said loop to data inputs of the selector means and the outputs of others of the shift register stages of the same loop to address inputs of the selector means.

6. A generator according to claim 5, in which the recirculatory shift register means comprises two recirculating loops, respective ones of the data inputs of the selector means being connected to each loop, and respective ones of the address inputs of the selector means being connected to each loop.

7. A pseudo-random binary sequence generator, comprising:
   selector means having p data inputs and q address inputs ($2^q \geq p$) for selecting at any instant one of the data input bits in accordance with the address input word to provide the generator output;
   recirculatory shift register means comprising at least one recirculating loop having a plurality of logic gates for logically combining the outputs of selected stages of the loop to provide a pseudo-random sequence;
   means connecting the p data inputs of the selector means to the outputs of selected shift register stages and for connecting the q address inputs of the selector means to the outputs of q selected shift register stages; and
   means for regularly loading a re-initialisation word into the shift register means.

8. A generator according to claim 7, wherein the loading means comprises:
   means for generating a periodic count word;
   means for generating a control word; and
   means for combining the count and control words whereby to alter the re-initialisation word every time it is regularly loaded into the shift register means.

9. A generator according to claim 8, in which the combining means comprise a circuit for complementing alternate count words.

10. A generator according to claim 8, in which the combining means comprises modulo-2 adding means for adding each count word to selected bits of the control word.

11. A generator according to claim 8, in which the periodic count word is a frame count word formed by counting successive video frames.

12. A generator according to claim 7, further including means operative subsequent to the loading of a reinitialisation word to clock the register means for a plurality of clock cycles before the generator output is utilised.

13. A generator according to claim 7, in which the recirculatory shift register means is arranged in normal operation in two recirculating loops, and the loading means when operated connects the shift register means of the two loops into a single shift register.

* * * * *